United States Patent [19]
Taromaru et al.

[11] Patent Number: 5,281,930
[45] Date of Patent: Jan. 25, 1994

[54] FREQUENCY MODULATOR

[75] Inventors: Makoto Taromaru, Fukuoka; Tomohiro Shika, Kasuga, both of Japan

[73] Assignee: Matsushita Electric Industrial Co., Ltd., Osaka, Japan

[21] Appl. No.: 892,885

[22] Filed: Jun. 3, 1992

[30] Foreign Application Priority Data

Jun. 4, 1991 [JP] Japan ................ 3-132587

[51] Int. Cl.$^5$ .................... H03C 3/00; H03L 7/08
[52] U.S. Cl. ..................... 332/127; 331/17; 331/23; 455/208
[58] Field of Search .............. 332/127; 331/16, 17, 331/23; 455/208, 260

[56] References Cited

U.S. PATENT DOCUMENTS

| | | | |
|---|---|---|---|
| 3,984,831 | 10/1976 | Jones et al. | 340/347 SY |
| 4,093,904 | 6/1978 | Burig et al. | 318/616 |
| 4,286,237 | 8/1981 | James | 332/128 |
| 4,417,448 | 11/1983 | Horn et al. | 62/6 |
| 4,469,993 | 9/1984 | Swanson et al. | 318/561 |
| 4,486,797 | 12/1984 | Workman | 360/78 |
| 4,534,176 | 8/1985 | Horn et al. | 62/6 |
| 4,546,329 | 10/1985 | Unger | 331/16 |
| 4,594,536 | 6/1986 | Tamagaki | 318/561 |
| 4,625,156 | 11/1986 | Komiya et al. | 318/85 |
| 4,629,954 | 12/1986 | Banzai et al. | 318/561 |
| 4,634,946 | 1/1987 | Moulds, III et al. | 318/561 |
| 4,675,582 | 6/1987 | Hommes et al. | 318/38 |
| 4,707,670 | 11/1987 | Dakin | 331/23 X |
| 4,733,151 | 3/1988 | Butts | 318/645 |
| 4,866,404 | 9/1989 | Vandegraaf | 331/23 X |
| 5,126,699 | 6/1992 | Kabler | 332/127 X |
| 5,130,676 | 7/1992 | Mutz | 331/23 X |

FOREIGN PATENT DOCUMENTS 0103412  6/1982  Japan ................... 332/127

Primary Examiner—David Mis
Attorney, Agent, or Firm—Lowe, Price, LeBlanc & Becker

[57] ABSTRACT

A frequency modulator includes a reference frequency oscillator, a voltage controlled oscillator provided with a control input terminal and a modulation input terminal, a frequency divider for dividing an output of the voltage controlled oscillator, a phase comparator for generating an output signal corresponding to a phase difference between an output of the reference frequency oscillator and an output of the divider, a first filter having an input terminal and an output terminal, the input terminal thereof being connected to an output terminal of the phase comparator, while the output terminal thereof being connected to the control input terminal of the voltage controlled oscillator, and a second filter having an input terminal and an output terminal, the input terminal being inputted a modulating signal and the output terminal being connected to the modulation input terminal of the voltage controlled oscillator. The second filter has a lower amplitude characteristics in a low frequency range within a modulation frequency band than that in a high frequency range within the same.

6 Claims, 5 Drawing Sheets $$f_p = \frac{1}{2\pi C_h R_h}$$

FREQUENCY MODULATOR

BACKGROUND OF THE INVENTION

The present invention relates to a frequency modulator provided with a phase locked loop controlling part.

A phase locked loop (hereinafter will be simply called as PLL) is used to obtain a number of various frequency signals with a good frequency stability from a single reference frequency source. This phase locked loop is often used as a local oscillator in a radio equipment, in recent years. When performing a frequency modulation (FM) on a transmitted carrier, these is often adopted a direct frequency modulating method such that modulating signals are superimposed upon a controlling voltage which controls the output frequency of a voltage-controlled oscillator (hereinafter simply called as VCO) of a PLL.

The following provides a description of a conventional frequency modulator, referring to an accompanying drawing. FIG. 8 is a block diagram of a conventional frequency modulator comprising a PLL.

In FIG. 8, reference numeral 1 denotes a reference signal generator. Used as the reference signal generator is, in general, a generator having a relatively high frequency-stability such as a crystal oscillator or the like. A phase comparator 2 outputs a signal proportional to a phase difference between two signals inputted there to. Reference numeral 3 denotes a low-pass filter, which may be made up of passive elements only, or of an active filter which comprises an active element such as a transistor or the like. Reference numeral 4 is a VCO, the frequency of which is varied in proportion to an input signal voltage, as shown in FIG. 10. A frequency divider 5 divides an input signal to output the divided signal to the phase comparator 2.

Hereinafter will be described an operation of the conventional frequency modulator having the above structure. A part of output signals from the VCO 4 are divided by the frequency divider 5. The phase comparator 2 compares a phase of an output signal from the frequency divider 5 with a phase of a reference signal from the reference signal generator 1. A phase difference signal outputted from the phase comparator 2 is fed back as a control voltage of the VCO 4 through the low-pass filter 3. The control voltage (an output voltage from the low-pass filter) drops, when the phase of the output signal from the divider 5 is leading ahead of the phase of a reference signal from the reference signal generator 1. To the contrary, the control voltage rises, when the phase of the output signal from the divider 5 lags behind the phase of the reference signal from the reference signal generator 1. Such a rise and fall of the control the VCO voltage is effective to control so that a phase difference between the phase of the output signal from the divider 5 and the phase of the reference signal from the reference signal generator 1 may be maintained constant. The phase difference, therefore, becomes constant in a steady-state, and a frequency of the output signal from the divider 5 and a frequency of the reference signal from the reference signal generator 1 are brought into conformity with each other. Accordingly, the following relationship is established:

$$fo = N \cdot fr$$

where fo: an output frequency of the VCO 4;
N: a dividing ratio of the divider 5; and
fr: a reference frequency of the reference signal generator.

An output signal having a frequency fo, which is an integral multiple of the reference frequency fr, may be obtained by varying the dividing ratio N of the divider 5.

In this frequency modulation, a modulating signal from the outside, e.g., an external voice signal, is superimposed upon a controlled input voltage of the VCO 4 so that a frequency generated from the VCO 4 is forced to be varied by the externally inputted signal.

However, the PLL is a negative fed-back circuit to keep the frequency of the VCO 4 constant, as described above. If a gain of the loop of the PLL is sufficiently large and the loop is stable, the frequency is little varied when a modulating signal is superimposed upon the controlled input voltage of the VCO 4. Here, the gain means a gain of an open loop transfer function. This open loop transfer function is the transfer function between a controlled input of the VCO and the output of the low-pass filter 3, when the controlled input of the VCO 4 is cut from the output of the low-pass filter.

Owing to the low pass filter 3, the gain of the transfer function is large in a low frequency range, getting smaller as the frequency becomes higher. A frequency at which a gain of the open loop transfer function is 1 is called a gain crossover frequency. A frequency modulation may therefore be performed on a modulating signal of a frequency equal to or higher than a crossover frequency, having a gain 1 or less. A general radiotelephone is designed to have a gain crossover frequency of about 300 Hz, at which a gain of the open loop transfer function is 1. In such a radiophone, the oscillation frequency of the VCO 4 is modulated in a voice band of about 300 Hz or higher.

To the contrary, a low frequency region cannot be modulated. An affect of a modulating signal added to the VCO 4 returns to an input of the VCO 4 through the divider 5, the phase comparator 2 and the low-pass filter 3. This acts as a negative feedback in a low frequency range, namely, acts to suppress the frequency deviation by the modulation (to suppress it not to depart from the frequency N·fr), leading thus to quite low modulation sensitivity.

In the gain crossover frequency (in the vicinity of 300 Hz, for example), phase delay due to the low-pass filter 3 operates as positive feedback to emphasize frequency deviation by the modulation, in which case a peak sometimes appears in the vicinity of the gain crossover frequency of the loop, as shown in FIG. 9. It is desirable that the frequency characteristics in modulation sensitivity be flat within a voice signal band. In order to eliminate such a peak in a conventional manner, it is necessary to set the loop gain at a smaller value and to precisely adjust values of respective elements in the low-pass filter 3 to drop the gain crossover frequency, whereby a frequency of the peak may become lower than that of the voice signal band. However, if the gain crossover frequency is dropped, a period of time required to change the frequency is increased. That is, a period of time from changing the dividing ratio of the divider 5 to when the oscillated frequency of the VCO 4 is focused within a range of tolerance deviation of the steady-state value and becomes stabilized, becomes longer. There is thus a disadvantage that a time period required to change the channel in a radiotelephone or the like is increased even if a peak is lowered close to the gain crossover frequency.

SUMMARY OF THE INVENTION

An object of the present invention is to overcome the above disadvantage by providing a frequency modulator with a PLL having a flat characteristic in modulation sensitivity of the modulating frequency. In the frequency modulator, suppressing an amplitude of the modulating signal in the vicinity of the PLL gain crossover frequency by the modulation weighting filter is effective to obtain a flat frequency characteristics in modulation sensitivity.

Therefore, there is provided a frequency modulator comprising a reference frequency oscillator, a voltage controlled oscillator provided with a control input terminal and a modulation input terminal, a frequency divider for dividing an output of the voltage controlled oscillator, a phase comparator for generating an output signal corresponding to a phase difference between an output of the reference frequency oscillator and an output of the divider, a first filter means having an input terminal and an output terminal, the input terminal thereof being connected to an output terminal of the phase comparator, while the output terminal thereof being connected to the control input terminal of the voltage controlled oscillator, and a second filter means having an input terminal and an output terminal, the input terminal being inputted a modulating signal and the output terminal being connected to the modulation input terminal of the voltage controlled oscillation, said second filter means having a lower amplitude characteristics in a low frequency range within a modulating frequency band than in a high frequency range within the same.

BRIEF DESCRIPTION OF THE DRAWINGS

This invention will be more fully understood through the following specification taken in conjunction with the accompanying drawings in which.

DETAILED DESCRIPTION OF PREFERRED EMBODIMENTS

Figure 1:
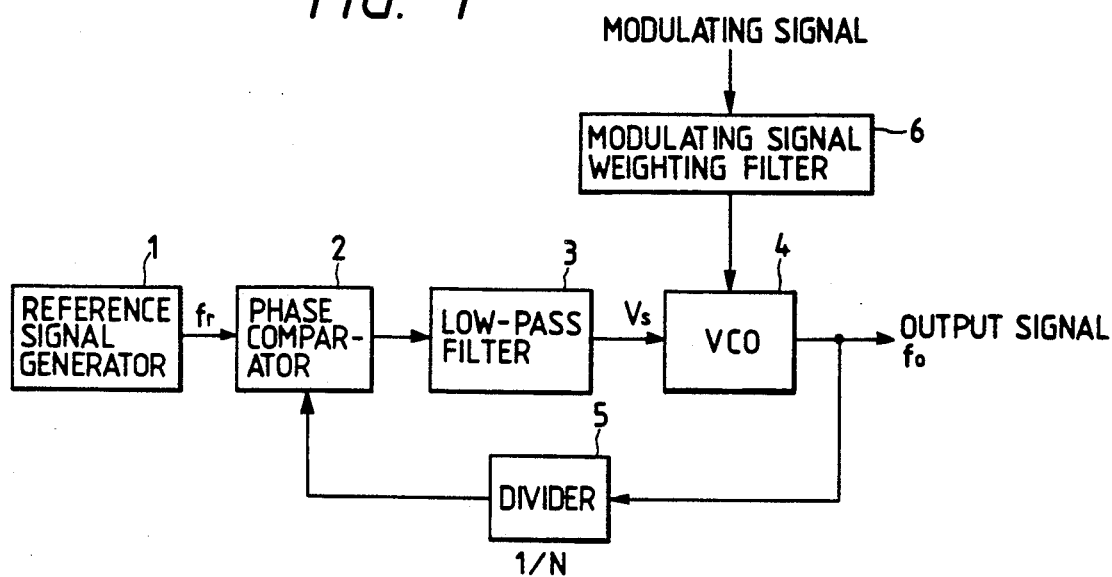
FIG. 1 is a block diagram showing a frequency modulator according to a first embodiment of this invention.

Hereinafter, preferred embodiments of the present invention will be described, referring to the drawings.

Figure 8:
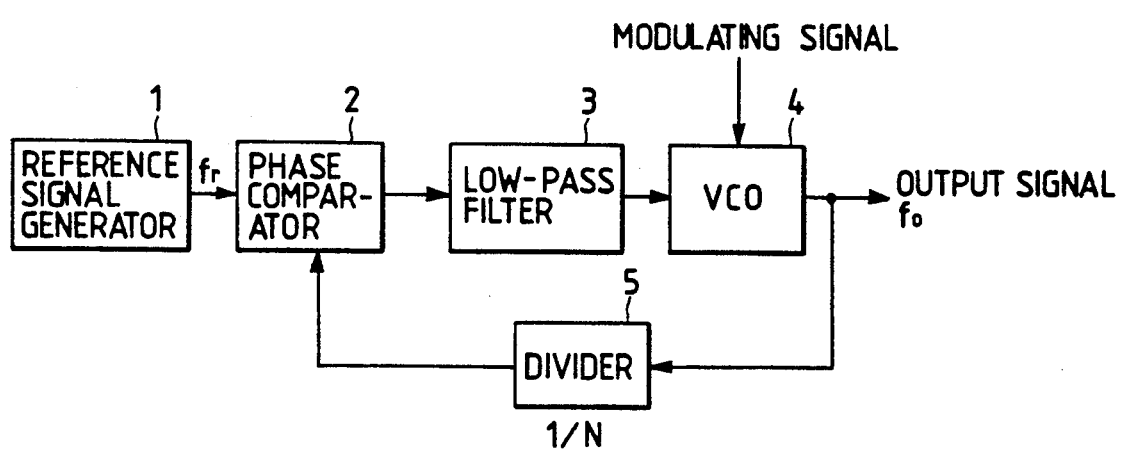
FIG. 8 is a block diagram of a conventional frequency modulator comprising a PLL.

FIG. 1 is a block diagram of a frequency modulator according to an embodiment of this invention. In FIG. 1, reference numeral 1 denotes a reference signal generator, 2 a phase comparator, 3 a low-pass filter, 4 a VCO and 5 a divider. These are quite similar to those of the conventional frequency modulator shown in FIG. 8. A modulation weighting filter 6 comprises a high-pass filter having frequency characteristics shown in FIG. 2. This embodiment has a structure in which the modulation weighting filter is added to a frequency modulator of a PLL, as is apparent upon comparison with the conventional modulator shown in FIG. 8.

Figure 9:
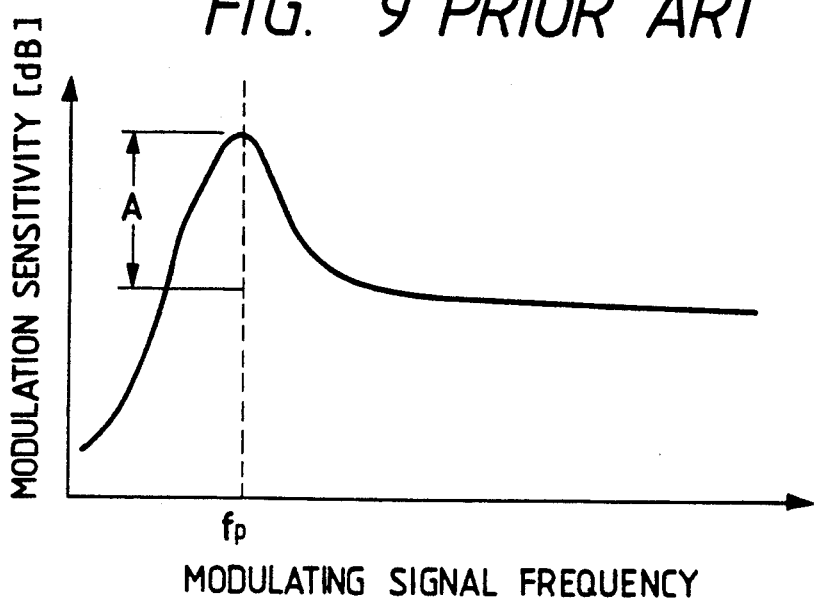
FIG. 9 is a graphical representation of characteristics in modulation sensitivity of the conventional frequency modulator.
Figure 10:
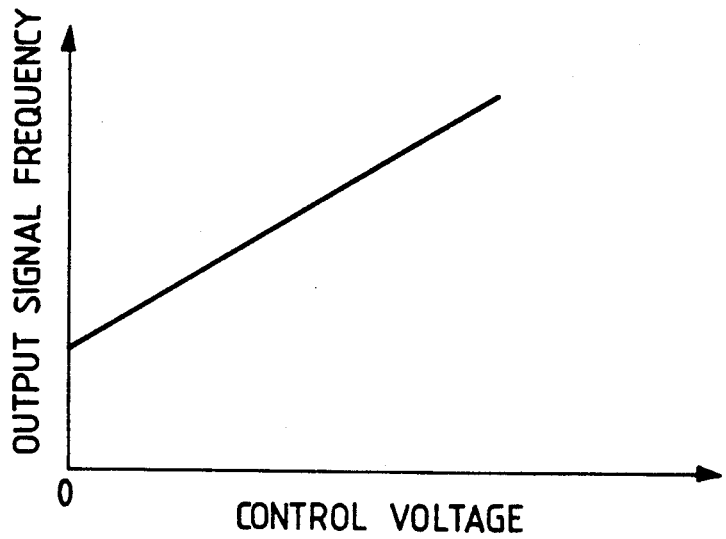
FIG. 10 is a graphical representation of frequency characteristics of a voltage controlled oscillator.

There will now be described an operation of a frequency modulator having the above structure. Without the modulation weighting filter 6, this frequency modulator operates in quite the same manner as the conventional PLL circuit, having, therefore, a frequency characteristic of modulating sensitivity with a peak at a frequency fp in the vicinity of the gain crossover frequency of the PLL, as shown in FIG. 9.

Figure 2:
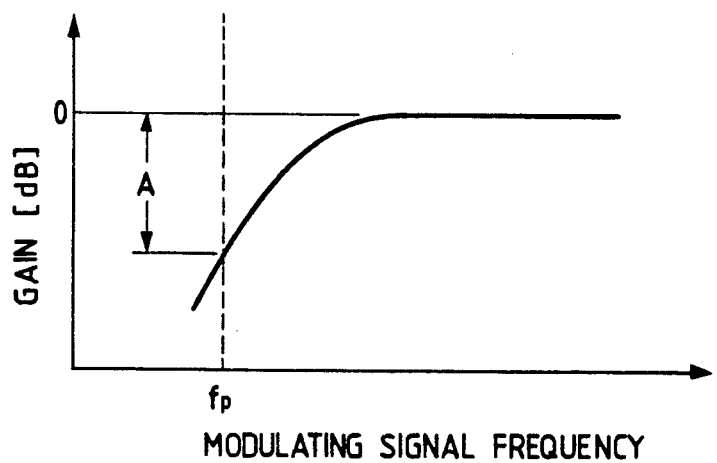
FIG. 2 is a graphical representation of frequency characteristics of a weighting filter for modulation employed in the first embodiment of this invention.

Meanwhile, the modulation weighting filter 6 is a high-pass filter which is designed so as to have a frequency characteristics shown in FIG. 2. Namely, it has an attenuation equal to a sensitivity increase A in the peak at a frequency fp of the frequency characteristic in modulation sensitivity shown in FIG. 9. Accordingly, a modulating signal having been passed through the modulation weighting filter 6 is suppressed in its low frequency range, that is, the modulating signal is given frequency characteristics in advance so as to cancel the sensitivity increase at the peak of the modulation sensitivity.

Figure 3:
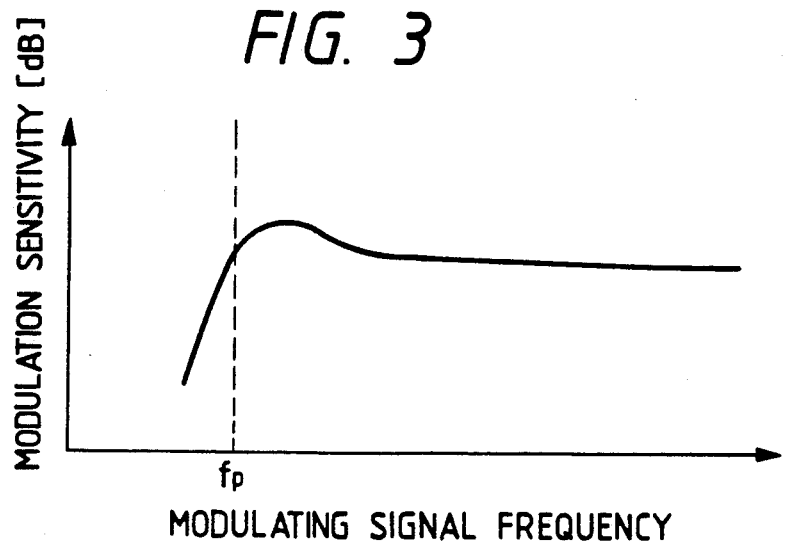
FIG. 3 is a graphical representation of frequency characteristics of the frequency modulator of the first embodiment.
Figure 4:
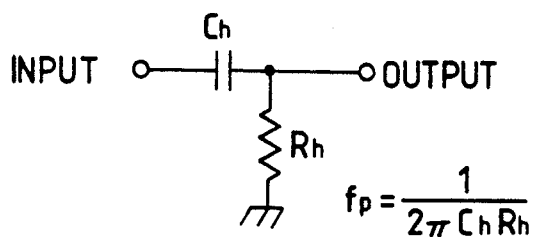
FIG. 4 is a block diagram showing a circuit of a weighting filter for modulation, as an example, in the first embodiment.

By giving such frequency characteristics to the modulating signal, it is possible to suppress the peak in the low range of the modulation sensitivity as shown in FIG. 3, thereby improving the modulation characteristic. A high-pass filter shown in FIG. 4 is adaptable in practice as the modulation weighting filter 6. This structure enables achievement of a system having a simple structure.

Figure 5:
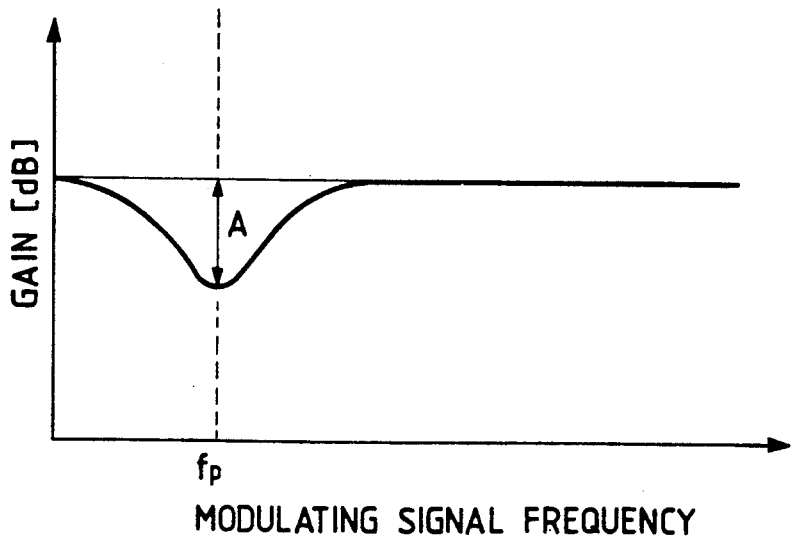
FIG. 5 is a graphical representation of frequency characteristics of a notch filter in the first embodiment.
Figure 6:
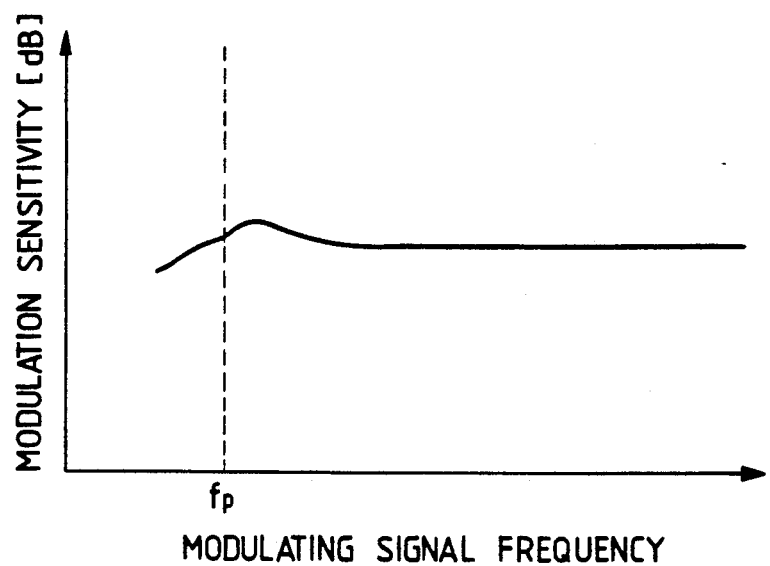
FIG. 6 is a graphical representation of modulation sensitivity characteristics of a frequency modulator employing the notch filter shown in FIG. 5.
Figure 7:
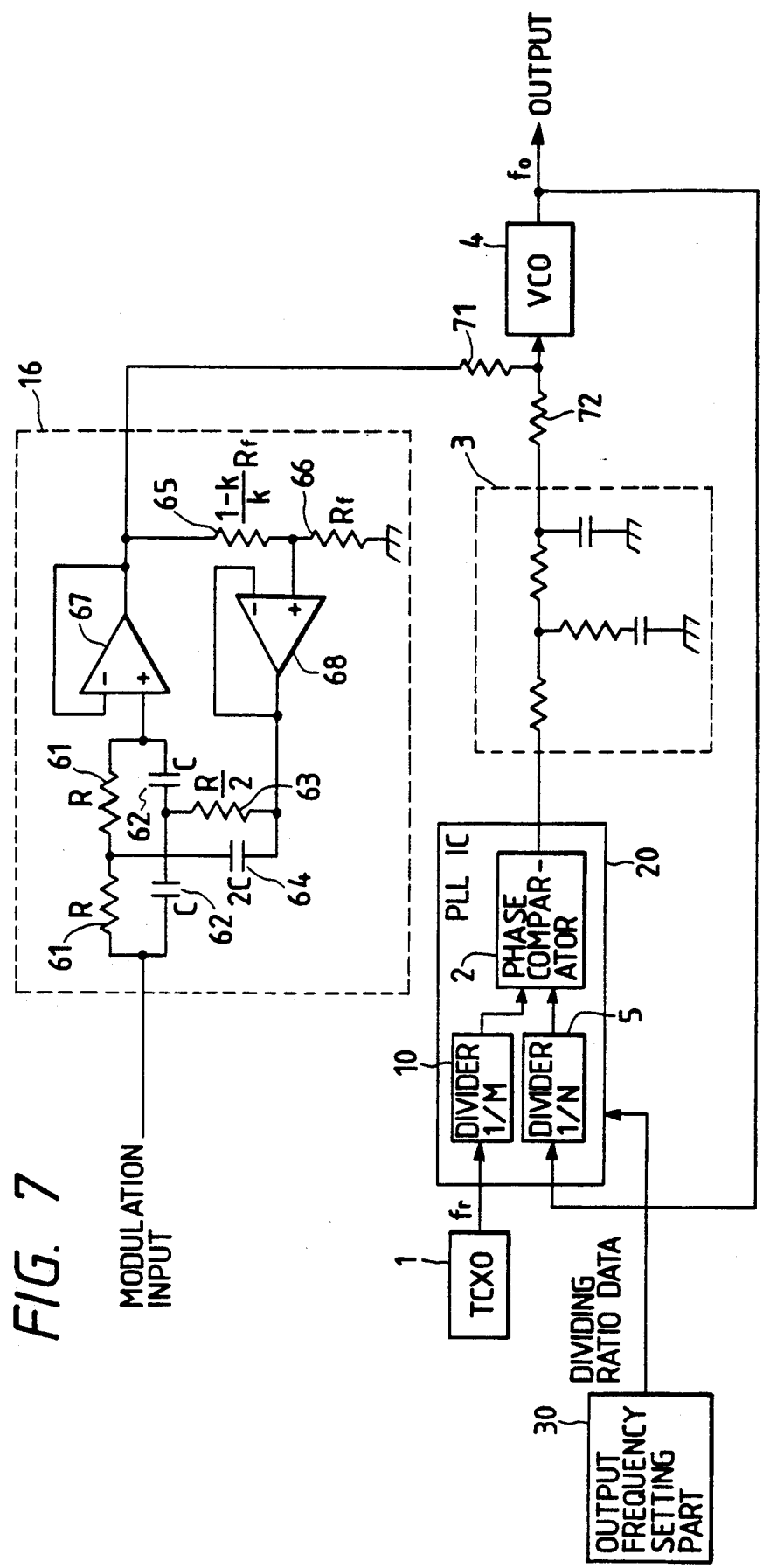
FIG. 7 is a block diagram of a frequency modulator according to a second embodiment of this invention.

FIG. 7 shows a schematic structure of a frequency modulator according to a second embodiment of this invention. In this embodiment, a notch filter having a frequency characteristic as shown in FIG. 5 is employed as the modulation weighting filter, whereby the frequency characteristic in modulation sensitivity of the output signal may be made flat, as shown in FIG. 6. In which case, the modulation sensitivity characteristic in the low range is improved and the frequency characteristic of the modulation sensitivity becomes flatter than the case where a high-pass filter is used as in the first embodiment.

In FIG. 7, reference numeral 1 denotes a reference signal generator, which is a crystal oscillator temperature compensated. Reference numeral 20 denotes a general-purpose PLL-IC having a general structure, which includes a divider 10 dividing a reference signal into 1/M, another divider 5 dividing an output signal into 1/N, and a phase comparator 2. Reference numeral 30 denotes an output frequency setting part. Based on dividing ratio data from the output frequency setting part 30, the dividing ratio is switched between the divider 10 and the divider 5. If this circuit is employed, for example, in a wireless telephone, this output frequency setting part 30 corresponds to a channel switching means.

A low-pass filter 3 comprises a plurality of capacitors and a plurality of resistors as shown. Reference numeral 4 denotes a VCO. A phase difference error signal obtained from an output of the low-pass filter 3 is fed to the VCO 4 via a resistor 72. The oscillated frequency of the VCO 4 varies corresponding to voltages of the inputted phase difference error signal and a modulating signal inputted via a resistor 71.

The above is a structure of a PLL circuit having a general frequency modulating function which is well known.

Reference numeral 16 denotes a notch filter provided as a modulation weighting filter. The notch filter 16 comprises resistors 61, 63, 65 and 66, capacitors 62 and 64, and operational amplifiers 67 and 68, as shown. Resistance values of the respective resistors are set as follows. If a resistance value of the resistor 61 is set at R, a resistance value of the resistor 63 is to be set at R/2. If a resistance of the resistor 66 is set at Rf, a resistance of the resistor 64 is to be set at $Rf(1-k)/k$. On the other hand, capacitances of the respective capacitors are set as follows. If a capacitance of the capacitor 62 is set at C[F], a capacitance of the capacitor 64 is to be set at 2C[F].

The notch filter having such a structure suppresses components in the vicinity of specific frequency of an inputted modulating signal to output it as a modulating signal to the VCO 4 via the resistor 71.

Next will be described the operation of the circuit of FIG. 1. Without the notch filter, the circuit operates in quite the same manner as a conventional well known PLL circuit. Namely, a phase difference between two signals inputted into the phase comparator 2 is a constant value (DC), and a frequency of these two input signals is made equal. Thus, an oscillated frequency fo of the VCO 4 in a non-modulated state becomes:

$$fo = n \cdot fr/M.$$

Without the notch filter 16, the circuit has a frequency characteristic in modulation sensitivity having a peak in the vicinity of the gain crossover frequency of the PLL shown in FIG. 9, similar to the first embodiment shown in FIG. 1. A peak frequency of this frequency characteristic is represented by fp.

On the other hand, the notch filter 16 is designed so that a center frequency of its notch characteristics becomes equal to said peak frequency fp.

That is, it is designed to have characteristics:

center frequency $= fp = 1/(2\pi CR)$; and maximum attenuation quantity $A = 20 \log\{4(1-k)\}$ [dB], as shown in FIG. 5. The center frequency is designed to be equal to a frequency at the peak of the frequency characteristic in modulation sensitivity shown in FIG. 9, and the maximum attenuation quantity is designed to be equal to a sensitivity increase A.

According to the present invention, it is possible to give flat characteristics in modulation sensitivity even in the low range to the modulating signal frequency, without affecting the characteristics of the phase locked loop system, by only adding the modulation weighting filter to the conventional frequency modulator of a PLL. Moreover, the peak of the modulation sensitivity characteristics which appears in the low frequency range in the conventional system may be suppressed so that a loop gain may be increased to obtain a high gain crossover frequency of the PLL. As a result, the present invention provides a frequency modulator having advantages such that a period of time is reduced from changing the dividing ratio of the divider to when the oscillated frequency is focused within a tolerance deviation of a steady-state value, whereby a quick frequency change may be achieved.

What is claimed is:

1. In a frequency modulator including a reference frequency oscillator, a voltage controlled oscillator provided with a control input terminal and a modulation input terminal for receiving a modulation input signal, a frequency divider for dividing a frequency of an output signal of the voltage controlled oscillator, a phase comparator for generating an output signal corresponding to a phase difference between an output of the reference frequency oscillator and an output of the divider and a first filter means having an input terminal and an output terminal, the input terminal thereof being connected to an output terminal of the phase comparator, while the output terminal thereof being connected to the control input terminal of the voltage controlled oscillator, the improvement wherein:

a modulating signal has a band limited frequency band, and a modulation weighting filter means receiving said modulating signal and providing said modulation input signal to said voltage controlled oscillator for reducing a peak in a modulation sensitivity frequency characteristic of said output signal of said voltage controlled oscillator.

2. A frequency modulator according to claim 1, wherein said modulation weighting filter means has a cut-off frequency lower than a cut-off frequency of said band limited frequency band of said modulating signal.

3. A frequency modulator according to claim 2, wherein said modulation weighting filter means comprises a high-pass filter.

4. A frequency modulator according to claim 3, wherein said high-pass filter has a cut-off frequency lower than a cut-off frequency of said first filter means.

5. A frequency modulator according to claim 1, wherein said modulation weighting filter means comprises a notch filter.

6. In a frequency modulator including a reference frequency oscillator, a voltage controlled oscillator receiving a control input signal and a modulation input signal, a frequency divider for dividing a frequency of an output signal of the voltage controlled oscillator, a phase comparator for generating an output signal corresponding to a phase difference between an output of the reference frequency oscillator and an output of the divider and a first filter means having an input terminal and an output terminal, the input terminal thereof being connected to an output terminal of the phase comparator, while the output terminal thereof being connected to an input terminal of the voltage controlled oscillator, the improvement wherein:

a modulating signal has a band limited frequency band, and a modulation weighting filter means receiving said modulating signal and outputting said modulation input signal to said voltage controlled oscillator for reducing a peak in a modulation sensitivity frequency characteristic of said output signal of said voltage controlled oscillator, further comprising an adding means having a plurality of input terminals and an output terminal, wherein:

a first input terminal of said adding means is connected to the first filter means;

a second input terminal of said adding means is connected to said modulation weighting filter means to receive said modulation input signal therefrom; and said output terminal of said adding means provides to said voltage controlled oscillator an output signal representing addition of output signals from the first filter means and said modulation weighting filter means.

* * * * *